United States Patent [19]

Jacobson et al.

[11] Patent Number: 4,957,901

[45] Date of Patent: Sep. 18, 1990

[54] METHOD OF MANUFACTURING AN OBJECT FROM SUPERCONDUCTIVE MATERIAL

[75] Inventors: Klas Jacobson; Hakan Johansson, both of Västerås, Sweden

[73] Assignee: ASEA Brown Boveri AB, Sweden

[21] Appl. No.: 244,113

[22] Filed: Sep. 14, 1988

[30] Foreign Application Priority Data

Sep. 17, 1987 [SE] Sweden .................... 8703600-0

[51] Int. Cl.$^5$ ............................................ H01L 39/12
[52] U.S. Cl. ................................. 505/1; 264/65; 264/325; 419/49
[58] Field of Search .................. 264/56, 65, 325, 570; 505/739, 822, 1, 809, 725; 419/49, 68

[56] References Cited

U.S. PATENT DOCUMENTS

| | | | |
|---|---|---|---|
| 4,339,271 | 7/1982 | Isaksson et al. | 419/49 OR |
| 4,719,078 | 1/1988 | Miyashita et al. | 264/65 X |
| 4,756,680 | 7/1988 | Ishii | 419/49 X |
| 4,826,808 | 5/1989 | Yurek et al. | 505/1 OR |
| 4,842,704 | 6/1989 | Collins et al. | 505/816 X |

OTHER PUBLICATIONS

"Problems in the Production of $YBa_2Cu_3O_x$ Superconducting Wire," by McCallum et al, *Advanced Ceramic Materials*, Jul. 1987 (vol. 2).

*Primary Examiner*—James Lowe
*Assistant Examiner*—Christopher A. Fiorilla
*Attorney, Agent, or Firm*—Watson, Cole, Grindle & Watson

[57] ABSTRACT

A method of making an object of superconductive material in the form of an oxide by isostatic pressing of a body preformed from a powder material with an oxygen-containing pressure medium at a temperature required for sintering of the preformed body, the powder material is an oxide of the metals contained in the superconductive material. Before the isostatic pressing is carried out, the preformed body is surrounded by a gas-tight casing with the ability to transport oxygen.

13 Claims, No Drawings

METHOD OF MANUFACTURING AN OBJECT FROM SUPERCONDUCTIVE MATERIAL

BACKGROUND OF THE INVENTION

It is known to manufacture objects of superconductive materials in the form of an oxide by isostatic pressing of a body preformed from a powdered material at a temperature necessary for sintering of the preformed body. The powder material comprises an oxide of the metals contained in the superconductive material. The starting powder material used often constitutes another, nonsuperconductive modification of the same oxide as the superconductive material consists of. The superconductive material is then formed of the powder material during the heat treatment to which the powder material is subjected when the object is manufactured. It is also possible to use a powder material in the form of the superconductive modification as starting material.

When the preformed body is subjected to the isostatic pressing at the sintering temperature according to the known method in order to give a desired dense, sintered product it is enclosed in a casing which, during the pressing, can prevent the pressure medium used, e.g., an inert or reducing gas, from penetrating into the powder body. It has been proved that such a method of manufacture is associated with problems which, at least to a great extent, can be ascribed to the great propensity of the powder material to give off oxygen at the temperature required for the pressing. This causes many materials which could be used for the casing to become oxidized, while the material in the preformed body is depleted of oxygen. Such a process may cause defects on the materials in the casing which deteriorate their ability to function as a gas-tight casing. Many other materials for the casing which withstand oxidation allow oxygen to diffuse through the casing, which also results in depletion of the preformed body with respect to oxygen. Such a depletion requires an after-treatment of the pressed and sintered object with oxygen to restore its original oxygen content. In that connection it may be difficult to achieve an end product with a desired crystalline structure which is uniform and free from phases without superconductivity. Such phases of an irreversible kind may be formed during the treatment. Because of the existing problems, it is difficult, with the technique used so far, to manufacture objects with the desired properties with an acceptable reproducibility.

SUMMARY OF THE INVENTION

The present invention is based on the realization that objects of superconductive material with high performance properties, such as high critical current density and good mechanical properties, can be manufactured with greater reproducibility than has previously been possible if an oxygen-containing gaseous pressure medium is used during the isostatic pressing and if special measures are taken to maintain the preformed body in contact with externally supplied oxygen. According to the present invention, this contact is brought about by arranging the preformed body with closed pores or with a gas-tight, oxygen-permeable casing before carrying out the isostatic pressing. If the preformed body is arranged with closed pores, it is possible to dispense with a gas-tight casing. By taking the steps stated above, a homogeneous distribution of oxygen can be maintained in the powder material during the isostatic pressing, which leads to an end product with a uniform crystal structure and uniform properties being obtained. Because no processes occur which lead to a depletion of the powder material with respect to oxygen, the final product can be manufactured in one step without any after-treatment. In this way, the occurrence of phases without superconductivity can be avoided.

More particularly, the present invention relates to a method of manufacturing an object of superconductive material in the form of an oxide by isostatic pressing of a body preformed from a powder material with a gaseous pressure medium at a temperature required for the sintering of the preformed body, the powder material comprising an oxide of the metals contained in the superconductive powder material, characterized in that the isostatic pressing is carried out with an oxygen-containing, gaseous pressure medium and that the preformed body is arranged with closed pores or is enclosed in a gas-tight casing with the ability to transport oxygen, before the isostatic pressing is carried out while sintering the preformed body.

The superconductive material is of a known kind and may advantageously be of the kind containing a rare earth metal. Preferably, it has the composition $Ln_1Me_2Cu_3O_{\alpha-\delta}$ or substantially the composition $Ln_1Me_2Cu_3O_{\alpha-\delta}$, whereby Ln consists of a rare earth metal (La-Lu) or of Y or of Sc or of a mixture of two or more of these metals, Me of Ba or Sr or a mixture of these metals or a mixture of one or both of these metals with Ca, where Cu may partially be replaced by one or more of Ag, Zn, Ni and Mo and O partially by one or more of F, Cl, Br, I and S, and whereby $\alpha-\delta$ has a value of between 7.3 and 6.5. $\delta$ preferably has a value of 7. That part of Cu and O, respectively, which may be replaced preferably amounts to 15% at the most. The superconductive material may consist of one or several phases, in chemical respect, of the composition stated above. The powder material, from which the object of the superconductive material is manufactured, may consist of the same superconductive material in powdered state or of a different powder material which, if no additions are made thereto, has the same chemical composition as the superconductive material but constitutes a non-superconductive modification. The particle size of the powder material is preferably 1–250 $\mu$m. According to an advantageous embodiment, single crystal platelets of powder material are preferably used.

According to an advantageous embodiment of the invention, a preformed body with closed pores may be manufactured by distributing a metallic material, which contains one or more of the metals contained in the superconductive material and which has a lower melting temperature than the superconductive material, in the powder material of oxide before forming and heat-treating the composite material thus obtained while forming a body with closed pores. An alloy of the above-mentioned metals is suitably used, preferably an alloy with amorphous structure which is manufactured, for example, by rapid solidification. The content of the metallic material suitably constitutes 0.1–50%, preferably 0.1–10%, of the total weight of this material and the powder material of oxide. During the manufacture of the object of the superconductive material, the metallic material is transferred into oxide, whereby this oxide and the powder material of oxide together give the superconductive material. The composition of the powder material and the alloy is adapted so as to attain a predetermined composition of the superconductive material in the object as manufactured, that is to say, the proportions between the total weight amounts of each one of the metals in powder material of oxide and alloy are adapted to be the same as in the superconductive material in the object as manufactured. If the metallic material has the shape of particles which are mixed into the powder material of oxide, its particle size is suitably 0.1–10 μm, however at the most 50% of the particle size of the powder material of oxide. Another way of distributing the metallic material is to provide the particles of the powder material of oxide with a coating of the metallic material. This can be achieved in a known way by vapour deposition or electrolytic deposition of the metallic material on the particles of the powder material or chemical reduction of the surface layer on the particles of the powder material itself. A further method is to arrange the metallic material in the form of thin films between layers of the powdered material, preferably in single crystalline form and most preferably with its crystallographic c-direction oriented perpendicularly to the films.

According to an advantageous embodiment of the invention there is used, as powder material of oxide, a material containing gadolinium or another ferro- or paramagnetic rare earth metal, such as samarium, and the powder material of oxide together with a possibly used metallic material is arranged in a magnetic field in conjunction with the forming of the preformed body. This makes it possible to orient the crystals in the powder material in one direction and to utilize the anisotropic properties of the material to an optimum extent for the intended purpose.

Other known ways of manufacturing preformed bodies with or without closed pores may be used when carrying out the present invention. One such way comprises subjecting the powder material of oxide to a compaction, for example arranged in a capsule of resilient material, such as a capsule of plastic. The compaction can be advantageously carried out without a binder at room temperature or other temperature which is considerably lower than the temperature at the isostatic pressing, using a gaseous, liquid or particulate pressure medium. The product can be given the desired shape by means of machining. For the preforming it is also possible to use, inter alia, conventional technique for manufacturing ceramic goods. The powdered material used for the formation of the preformed body is then mixed before the forming with a temporary binder, for example methyl cellulose, cellulose nitrate, an acrylic binder, or a polyvalent alcohol. It is important that the binder is free from water. After the preforming, the binder is driven off by heating so that the preformed body becomes free of binder. In those cases where the preformed body is arranged with closed pores, it is subjected to a presintering at a temperature required for the formation of closed pores.

In those cases where the preformed body before the isostatic pressing is surrounded by a gas-tight casing with the ability to transport oxygen, the casing may advantageously consist of glass or of a metallic material. In the former case a preformed gas-tight capsule of glass can be used, in which the glass has a softening temperature which preferably does not exceed 800° C. Examples of suitable glass types are a glass containing 80.3 per cent by weight $SiO_2$, 12.2 per cent by weight $B_2O_3$, 2.8 per cent by weight $Al_2O_3$, 4.0 per cent by weight $Na_2O$, 0.4 per cent by weight $K_2O$ and 0.3 per cent by weight CaO, a glass containing 58 per cent by weight $SiO_2$, 9 per cent by weight $B_2O_3$, 20 per cent by weight $Al_2O_3$, 5 per cent by weight CaO and 8 per cent by weight MgO as well as certain lead silicate glasses Suitable metallic materials in a casing are silver and several silver alloys, for example Ag-Pt and Ag-Pd, preferably in the form of a foil. These casings of glass and of silver or silver alloy are gas-tight but have the ability to transport oxygen by being able to dissolve or otherwise taking up oxygen and giving off oxygen. It is also possible to use both a casing of glass and a casing of a metallic material to more effectively counteract or prevent other gas than oxygen gas from the pressure medium from being brought into contact with the superconductive material. For the same reason, it may in certain cases be suitable to enclose also a preformed body with closed pores in a casing of glass or other metallic material, or both.

To prevent a penetration of glass into the preformed body, it is suitable to arrange on the preformed body, inside the glass casing, a barrier layer of a powdered material, such as boron nitride or aluminium oxide, which counteracts the penetration of glass in molten state into the preformed body.

The pressure medium may consist in its entirety of oxygen gas or a mixture of oxygen gas and a gas which in this connection is inert, such as argon, krypton or nitrogen gas, the ability of which to penetrate through the casing is far inferior to that of the oxygen. Air, inter alia, is a useful pressure medium. The oxygen-containing pressure medium has an oxygen partial pressure of at least 10 kPa during the isostatic pressing. In those cases where the pressing is carried out without the use of a gas-tight casing, it is essential that the partial pressure of carbon dioxide in the pressure medium amounts to at most 1 Pa. In certain cases it may be an advantage to treat the preformed body in an inert atmosphere with a carbon dioxide partial pressure of at the most 1 Pa at a temperature which is somewhat lower (at least 100° C.) than the temperature of the isostatic pressing in order thus to remove carbonates from the powder material by driving off carbon dioxide.

The pressure and temperature of the isostatic pressing are dependent on the type of superconductive material. Normally, however, the pressure should amount to at least 50 MPa, preferably to at least 100 MPa, and the temperature to at least 700° C., preferably to 750°–950° C. The temperature should not be maintained so high that molten phases are formed of the material in the preformed body since this involves a risk of such molten phases being irreversibly transformed into phases without superconductivity.

The invention will be explained in greater detail by describing a number of examples.

EXAMPLE 1

10 parts by weight of a powder material consisting of $Y_1Ba_2Cu_3O_{6.9}$ with a particle size of 10 μm are mixed with one part by weight of a metallic material in the form of a powder of an amorphous alloy of Y, Ba and Cu in the same proportions in which these metals are contained in the powder material of oxide and with a particle size of 1 μm, so that the metallic material is distributed homogeneously in the powder material of oxide. The mixture is hot-pressed in a conventional single-axis tool at 800° C. without pressure or at a low pressure (1–2 MPa) into a body with a circular-cylindrical shape. This results in a preformed body which is presintered and has closed pores. Its density is about 80% of the theoretical.

The preformed body thus obtained is subjected to an isostatic pressing in a high-pressure furnace having heating elements of platinum and an oxidation resistant lining at a temperature of 900° C. and a pressure of 200 MPa for a period of 1 hour. The pressure medium consists of a mixture of oxygen gas and argon in which the partial pressure of the oxygen gas is 10 MPa and the partial pressure of the argon is 190 MPa. After the isostatic pressing, the high pressure furnace is slowly cooled adiabatically in order for the structure of the product, formed at the sintering temperature, to be transformed from tetragonal to orthorhombic structure. The end product has a near theoretical density and consists of superconductive $Y_1Ba_2Cu_3O_{6.9}$.

EXAMPLE 2

A powder material of oxide of the kind stated in Example 1 is placed in a capsule of plastic, for example softened polyvinyl chloride, or of rubber. The capsule has a circular-cylindrical shape with larger dimensions than the object which is to be manufactured. The capsule with the powder is subjected to a compaction at 300 MPa at room temperature with oil as pressure medium, whereby a preformed body in the form of a manageable solid cylindrical body is obtained.

The preformed body is placed in a capsule of glass with a suitable shape, which is evacuated and sealed. The capsule consists of a glass containing 80.3 per cent by weight $SiO_2$ 12.2 per cent by weight $B_2O_3$, 2.8 per cent by weight $Al_2O_3$, 4.0 per cent by weight $Na_2O$, 0.4 per cent by weight $K_2O$ and 0.3 per cent by weight CaO. The capsule with its contents is placed in a high pressure furnace of the kind stated in Example 1. The temperature of the furnace is successively raised to 900° C., whereafter a pressure of 200 MPa is applied and the temperature maintained at 900° C. for approximately one hour. As pressure medium a mixture of oxygen gas and argon, of the kind stated in Example 1, is used. After the isostatic pressing, the high pressure furnace is slowly cooled adiabatically in order for the structure of the product, formed at the sintering temperature, to be transformed from tetragonal to orthorhombic. The end product has a near theoretical density and consists of the same superconductive material as is obtained according to Example 1.

The glass has the ability to dissolve and take up oxygen, which makes it possible to transport oxygen through the casing but it prevents, in all essentials, the argon from penetrating through. Therefore, in all essentials the argon provides the pressure on the casing which is necessary for the isostatic pressing.

EXAMPLE 3

An object is manufactured in a manner analogous to that shown in Example 2 with the difference that the preformed body is enclosed in a casing of a silver foil instead of one of glass. The silver foil, which may have a thickness of 100 μm, is then applied around the preformed body and is brought to surround it hermetically by welding together adjacent edges on the foil. In a manner analogous to that of the glass, the silver foil has the ability to selectively allow oxygen to pass through and prevent the penetration of argon.

EXAMPLE 4

An object is manufactured in the manner stated in Example 1 with the difference that the preformed body with closed pores is enclosed in a casing of silver foil before it is placed in the high pressure furnace to be subjected to isostatic pressing. In this way, a possible harmful effect of a gas other than oxygen gas in the pressure medium on the material in the preformed body is counteracted or prevented.

EXAMPLE 5

An object is manufactured in a manner analogous to that shown in Example 2 with the difference that a silver foil with a thickness of 100 μm is applied around the glass on the preformed body, before the preformed body is placed in a high pressure furnace and subjected to the isostatic pressing. The use of double casings with the ability to selectively allow oxygen to pass through and prevent the passage of argon gives increased security against pressure medium leaking in, since the casing around the preformed body becomes gas-tight even if a defect should arise in one of the two gas-tight casings. In addition, the use of two casings, as is clear from the above, may entail a more effective separation of oxygen and argon as well as any other indifferent gas, such as nitrogen gas, in the pressure medium, thus minimizing the risk of penetration of harmful pressure gas into the preformed body.

EXAMPLE 6

A powder material of the kind stated in Example 1 is mixed with water-free glycerin and is formed into an elongated body by extrusion. The glycerin is driven off from the powder body thus formed so as to become free of this temporary binder.

The preformed body is provided with a gas-tight casing and is pressed isostatically in any of the ways described in Example 2, 3 or 5.

Instead of using $Y_1Ba_2Cu_3O_{6.9}$, other powder materials can be used in the above Examples, such as analogous compounds in which Y is completely or partially replaced by Sc and/or a rare earth metal La-Lu and Ba completely or partially replaced by Sr.

EXAMPLE 7

10 parts by weight of a powder material consisting of $Y_{1.1}Ba_2Cu_{3.02}O_{6.9}$ with a particle size of 10 μm are mixed with one part by weight of a eutectic alloy of 55 atomic per cent Cu and 45 atomic per cent Ba with a particle size of 1 μm. The mixture is hot-pressed in a single-axis tool at 570° C. without pressure to form a body with a circular-cylindrical shape. This results in a preformed body which is presintered and has closed pores. The body thus preformed is subjected to an isostatic pressing in a manner described in Example 1 but at a temperature of 920° C. After cooling, an object of superconductive material with the composition $Y_1Ba_2Cu_3O_{6.9}$ is then obtained.

EXAMPLE 8

10 parts by weight of a powder material consisting of $Y_1Ba_{2.2}Cu_{3.04}O_{6.9}$ with a particle size of 10 μm are mixed with one part by weight of a eutectic alloy of 72 atomic per cent Cu and 28 atomic per cent Y with a particle size of 1 μm. The mixture is hot-pressed in a single-axis tool at 860° C. without pressure to form a body with circular-cylindrical shape. This results in a preformed body which is presintered and has closed pores. The body thus preformed is subjected to an isostatic pressing in a manner described in Example but at a temperature of 930° C. After cooling, an object of superconductive material with the composition $Y_1Ba_2Cu_3O_{6.9}$ is then obtained.

EXAMPLE 9

10 parts by weight of a powder material with the composition $Y_1Ba_{2.2}Cu_{3.264}O_{7.1}$ with a particle size of 10 μm are mixed with one part by weight of a eutectic alloy of 73.5 atomic per cent Yb and 26.5 atomic per cent Cu with a particle size of 1 μm. The mixture is hot-pressed in a single-axis tool at 650° C. without pressure to form a body with circular-cylindrical shape. This results in a preformed body which is presintered and has closed pores. The body thus preformed is subjected to an isostatic pressing in a manner described in Example 1 at a temperature of 900° C. After cooling, an object of superconductive material with the composition $Y_{0.91}Yb_{0.09}Ba_2Cu_3O_{6.9}$ is then obtained.

EXAMPLE 10

10 parts by weight of a powder material with the composition $Gd_1Ba_{2.2}Cu_{3.17}O_{6.9}$ with a particle size of 10 μm are mixed with one part by weight of a eutectic alloy of 43 atomic per cent Gd and 57 atomic per cent Cu with a particle size of 1 μm. The mixture is hot-pressed in a single-axis tool without pressure at 830° C. to form a body with circular-cylindrical shape. This results in a preformed body which is presintered and has closed pores. The body thus preformed is subjected to an isostatic pressing in a manner described in Example 1 but at a temperature of 920° C. After cooling, an object of superconductive material with the composition $Gd_1Ba_2Cu_3O_{6.9}$ is then obtained.

EXAMPLE 11

10 parts by weight of a powder material consisting of $Gd_1Ba_2Cu_3O_{6.8}$ with a particle size of 5 μm are suspended together with one part by weight of an amorphous alloy of $Y_1Ba_2Cu_3$ with a particle size of 1 μm in methanol in a plastic container. The suspension is carefully stirred, for example with the aid of ultrasonics. The container with contents is then placed in a homogeneous magnetic field with a flux density of at least 1 Tesla, where the particles are allowed to sediment. The particles containing Gd are then oriented in the same crystallographic direction in the sediment, which in the form of a cake is formed at the bottom of the container. The cake is dried and hot-pressed in a single-axis tool at 800° C. This results in a preformed body which is presintered and has closed pores. The body thus preformed is subjected to an isostatic pressing with a subsequent cooling in a manner described in Example 1. This results in an object of superconductive material with the composition $Y_{0.09}Gd_{0.91}Ba_2Cu_3O_{6.85}$ which in chemical respect consists of two different phases, namely, $Y_1Ba_2Cu_3O_{6.85}$ and $Gd_1Ba_2Cu_3O_{6.85}$, respectively.

EXAMPLE 12

A powder material consisting of $Gd_1Ba_2Cu_3O_{6.8}$ with a particle size of 10 μm is coated in sequential order, by vapour deposition, with layers of Gd, Ba and Cu, all with a thickness of about 0.1 μm. Ba is the middle layer. The coated particles are suspended in methanol in a plastic container. The container with contents is placed in a homogeneous magnetic field with a flux density of 1 Tesla, whereby the particles are oriented in the same crystallographic direction in the sediment which in the form of a cake is obtained at the bottom of the container. The cake is treated in the manner described in Example 11. During the hot pressing the layers of Gd, Ba and Cu form a layer of $Gd_1Ba_2Cu_3$. The end product formed consists of an object of superconductive material with the composition $Gd_1Ba_2Cu_3O_{6.8}$.

EXAMPLE 13

A powder material consisting of $Gd_1Ba_2Cu_3O_{6.8}$ with a particle size of 100 μm is heated to 800° C. in an atmosphere of argon containing 2 per cent by volume hydrogen gas until the surface layer of the particles is reduced to metal to a depth of 5 μm. Each particle of the starting material of oxide is thus given a coating of a metallic material in the form of $Gd_1Ba_2Cu_3$ with a thickness of 5 μm. The powder contents are hot-pressed in a single-axis tool without pressure at a temperature of 750° to form a body with circular-cylindrical shape. This results in a body with closed pores. The body thus preformed is subjected to an isostatic pressing in a manner described in Example 1 at a temperature of 900° C. After cooling, an object of superconductive material with the composition $Gd_1Ba_2Cu_3O_{6.8}$ is obtained.

EXAMPLE 14

The powder material of oxide with a coating of a 5 μm thick layer of $Gd_1Ba_2Cu_3$, manufactured according to Example 13, is suspended in isooctane and treated in the manner described in Example 12 for crystallographic orientation of the particles before hot pressing for the formation of a preformed body with closed pores is carried out and the preformed body is subjected to isostatic pressing. The superconductive end product thus formed consists of $Gd_1Ba_2Cu_3O_{6.8}$.

EXAMPLE 15

A powder material with the composition $Y_1Ba_2Cu_3O_7$ with a particle size of 2 μm is cold-pressed into a circular-cylindrical shape in a single-axis tool. The body thus obtained is sintered at 920° C. to 92% of the theoretical density in an inert atmosphere (argon) in a first furnace. The pores thus become closed. The body thus sintered is isostatically pressed in another furnace in an oxygen-containing atmosphere without an extra casing under the same conditions as in Example 1.

EXAMPLE 16

A powder material in the form of 10 parts by weight 10 μm large single crystals of $Yb_1Ba_2Cu_3O_{6.8}$ is mixed in inert atmosphere with 4 parts by weight of a metallic powder of the composition $Yb_1Ba_2Cu_3$. The powder body is cold-pressed in a single-axis tool in inert atmosphere. The preformed body thus obtained is heated, in inert atmosphere (furnace), to about 450° C., whereby oxygen from the oxide is released and starts oxidizing the metallic material. After two hours the inert atmosphere is changed to oxygen gas atmosphere. After one more hour the temperature is raised to 930° C. The body thus sintered is treated with isostatic pressing in the same way as in Example 1.

EXAMPLE 17

A powder in the form of 10 parts by weight 20 μm large single crystals of $Gd_1Ba_2Cu_3O_{6.9}$ is mixed, in liquid nitrogen, with 4 parts by weight metallic powder of the composition $Yb_1Ba_2Cu_3$. The powder is allowed to sediment in a magnetic field of 1.5 Tesla. The test body thus obtained is heated in inert atmosphere (argon) in the same way as in Example 16. The resulting material is a composite of $Gd_1Ba_2Cu_3O$ and $Yb_1Ba_2Cu_3O$. This material is isostatically pressed under the same conditions as in Example 1.

EXAMPLE 18

A mixture of powder of the same kind as in Example 17 is worked and pressed isostatically in the manner described in Example 6.

EXAMPLE 19

A superconducting material is manufactured in the manner described in Example 15, but the sintering and the isostatic pressing are carried out in the same furnace.

EXAMPLE 20

On material consisting of 2 cm wide and 0.05 mm thick amorphous metallic bands of the composition $Yb_1Ba_2Cu_3$ there is applied, by shaking, a 50 μm thick layer of thin (in the crystallographic c-direction) square single crystals of $Yb_1Ba_2Cu_3O_7$ with a lateral length of 20 μm, so that the crystals are oriented with the large plane surface towards the band. On top of this there is applied one further band of the composition mentioned and a new powder layer. The process is repeated until a 1 mm thick composition is obtained. The body thus obtained is pressed in a single-axis tool with the press force perpendicular to the plane of the bands. The body is heated in inert atmosphere (argon), while maintaining the single-axis pressure, to about 470° C., whereby the oxygen which is thus given off from the oxide crystals starts oxidizing the band. After 30 minutes, the oxygen partial pressure is increased to 100 Pa. In the course of one hour the oxygen partial pressure is then increased to 10 kPa. Thereafter sintering in oxygen atmosphere at 910° C. for 20 hours is performed. The treatment is terminated by isostatic pressing without a capsule under the conditions described in Example 1.

We claim:

1. A method of manufacturing an object of a superconductive metallic oxide material comprising the steps of:
    (a) providing a preformed body of a powdered material which can provide the superconductive metallic oxide material,
    (b) enclosing the preformed body in a gas-tight casing which is made of a casing material which can transport oxygen, and
    (c) forming the object by isostatically pressing the gas-tight casing with preformed body therein with a gaseous pressure medium and at a temperature sufficient to sinter the preformed body, the gaseous pressure medium comprising oxygen gas and another gas whose ability to penetrate the gas-tight casing is much lower than that of oxygen, the oxygen gas penetrating through the gas-tight casing to maintain a homogeneous oxygen content in the preformed body therein.

2. Method according to claim 1, wherein said gas-tight casing comprises a glass casing having the ability to transport oxygen.

3. Method according to claim 1, wherein said gas-tight casing comprises a metal casing having the ability to transport oxygen.

4. Method according to claim 2, wherein the gas-tight casing includes a metal casing having the ability to transport oxygen surrounding the glass casing.

5. Method according to claim 4, wherein the metal casing consists of a silver foil.

6. Method according to claim 1 wherein the superconductive metallic oxide material at least substantially has the composition $Ln_1Me_2Cu_3O_{\alpha-\delta}$
    wherein Ln is a rare earth metal (La-Lu), Y, Sc, or mixtures thereof;
    wherein Me is:
        (i) Ba, Sr, or mixtures thereof
        (ii) Ba and Ca, Sr and Ca, or mixtures thereof;
    wherein Cu may be partially replaced by an element which is Ag, Zn, Ni, Mo, or mixtures thereof;
    wherein O may be partially replaced by an element which is F, Cl, Br, I, S or mixtures thereof;
    and wherein $\alpha-\delta$ has a value between 7.3 and 6.5.

7. Method according to claim 6, wherein $\alpha$ has a value of 7.

8. Method according to claim 1, wherein said powder material comprises a material containing gadolinium or any other ferro- or paramagnetic rare earth metal and wherein in step (a) the powder material is arranged in a magnetic field whereby crystallographic orientation occurs.

9. Method according to claim 1, wherein the partial pressure of oxygen gas in the gaseous pressure medium amounts to at least 10 kPa.

10. Method according to claim 1, wherein step (c) is carried out at a temperature of 750°–950° C. and at a pressure of at least 50 MPa.

11. Method according to claim 1, wherein the gaseous pressure medium contains carbon dioxide and the partial pressure of carbon dioxide in the gaseous pressure medium is at most 1 Pa during step (c).

12. Method according to claim 1, wherein the powder material of step (a) comprises a material of single crystals.

13. Method according to claim 1, wherein the preformed body comprises a stack of alternating layers of an amorphous metallic material and a powdered material in single crystal form.

* * * * *